United States Patent [19]
Watkins

[11] Patent Number: 6,002,247
[45] Date of Patent: Dec. 14, 1999

[54] METHOD FOR DETERMINING CORRECT PAIRING OF BUNDLED TWISTED WIRE PAIR CIRCUITRY

[76] Inventor: Lee A. Watkins, 1912 Calle Salto, Thousand Oaks, Calif. 91360

[21] Appl. No.: 08/818,431

[22] Filed: Mar. 17, 1997

Related U.S. Application Data

[60] Provisional application No. 60/023,381, Aug. 7, 1996.

[51] Int. Cl.⁶ ................................... G01R 19/00
[52] U.S. Cl. .............................. 324/66; 324/628; 324/539
[58] Field of Search .............................. 324/66, 539, 616, 324/628, 51

[56] References Cited

U.S. PATENT DOCUMENTS

| | | | |
|---|---|---|---|
| 5,420,512 | 5/1995 | Spillane | 324/539 |
| 5,436,555 | 7/1995 | Locke | 324/66 |
| 5,530,367 | 6/1996 | Bottman | 324/616 |
| 5,548,222 | 8/1996 | Jensen | 324/628 |

*Primary Examiner*—Josie Ballato
*Assistant Examiner*—Thomas Valone
*Attorney, Agent, or Firm*—Gene W. Arant; Larry D. Baker

[57] ABSTRACT

An electrical cable containing two or more twisted pairs of wires and having terminals at one end connected to corresponding wires is tested for possible mis-pairing of an assumed wire pair. At that end of the cable, all terminals except the two for the assumed wire pair are connected to ground. A test signal is then applied to a first terminal for the assumed wire pair, and at the same time a measurement is made of a response signal received at the second terminal for the assumed wire pair. The test signal is a time-varying signal. The strength of the response signal is compared to the test signal to establish whether the assumed pair of wires are in fact wound to each other.

4 Claims, 3 Drawing Sheets

METHOD FOR DETERMINING CORRECT PAIRING OF BUNDLED TWISTED WIRE PAIR CIRCUITRY

This application claims benefit of my provisional patent application Ser. No. 60/023,381 filed Aug. 7, 1996.

FIELD OF THE INVENTION

The present invention relates to a method and apparatus for testing and troubleshooting electrical cables that contain multiple twisted-wire-pair circuits bundled together.

BACKGROUND OF THE INVENTION

It has long been known to test electrical circuits either to establish their continuity, or to discover open circuits, short circuits, or other mistakes that electricians may have made in connecting the wires. Many kinds of apparatus have been used for these purposes.

One type of manufactured cable is the so-called "satin cable", which is flat and has all its wires in a side-by-side relationship and encased in a cover material. While short circuits, open circuits, or grounds can still occur in this type of cable, the configuration of this cable as manufactured makes it essentially impossible to mix up wire pairs inside the cable, and also reduces the likelihood of mixing up wiring connections at the cable ends.

The twisted pair circuit enjoys an advantage for alternating current operation in that currents passing through it will have decreased interaction with the surrounding environment. Thus in telephone circuitry, for example, twisted-pair circuits that occupy a common housing have far less mutual interference or "cross-talk" between circuits than if only straight wires were used.

The present invention relates to cables having a plurality of twisted-pair circuits bundled together in a common package. In addition to the possibility of short circuits or open circuits, the use of this type of cable also involves a risk of mixing up wiring connections at the cable ends, or of mispairing the wires inside the cable even if they were correctly connected at the cable ends. When multiple circuits are present, the problem of complete and accurate testing is complicated and time-consuming.

Correctly assembling and installing twisted pair cable is a difficult task. The right-hand wire and the left-hand wire of a pair change places every time the wires are twisted by 180 degrees. Even with good techniques for color coding of the wires it is still relatively easy to make a mistake in connecting to the contacts or terminals at the cable ends. The wires may be connected to correct contacts or terminals at the ends of the cable, but nevertheless may have been mis-paired inside the cable, where the error is difficult to detect. The electrician may connect the wire ends in exactly the same manner at each end of the cable, but may have misunderstood the plan by which the wires were to be connected, so there may still be mis-paired wires inside the cable.

Heavy demands are made upon circuitry when wiring that would in earlier times have carried only voice signals is now required to carry data signals at binary digit rates of 100,000 or more bits per second. A very slight degradation in circuit performance can quite significantly increase the probability of error in data transmission.

While standard methods of testing have been very effective for most purposes, one of the most subtle and difficult problems is cross-talk or mutual interference between adjacent circuits that appear to be correctly wired, but in fact are not. Specifically, the following scenario may sometimes arise.

A cable containing four wires forming two separate two-wire circuits is connected at each of its ends to terminals or contacts A, B, C, and D. The wires of one wire pair are connected to the A and B terminals at each end of the cable, while the wires of the other wire pair are connected to the C and D terminals. The tests made for continuity, short circuits, open circuits, or grounds, disclose no problem. However, inside the cable package, wires A and C are twisted together and wires B and D are twisted together. In other words, the wires are mis-paired inside the cable. In actual operation of the circuits to transmit data signals, the cross-talk or mutual interference between the A–B circuit and the C–D circuit will therefore be intolerable.

PRIOR ART METHODS

The methods of testing for mispaired wires in twisted-wire-pair cables that have hitherto been in use have left much to be desired in that the apparatus has been complicated, and the methods of performing the tests have been cumbersome.

The most traditional prior art method consists in injecting a signal into a first two-wire circuit and then observing the strength of the resulting signal that appears on a second and adjacent two-wire circuit. This provides a direct measurement of cross-talk. The magnitude of the resulting signal is then compared to a standard to determine circuit acceptability.

Another prior art method consists of injecting a pulse into a wire other than the two-wire circuit being tested, and measuring the responses on each of the two wires of the circuit that is being tested. The signal responses on the two wires are compared, and if equal, would indicate that the two wires are wound together. This method requires a very sensitive measurement, however.

The common practice of testing for mispaired wires by measuring cross-talk between wire pairs requires that both ends of the cable be utilized. Test instrumentation is connected at one end of the cable, and a termination load of predetermined characteristics is connected at the other end.

SUMMARY OF THE INVENTION

My novel method is entirely different. Instead of measuring the spill-over of energy from one circuit to another, I establish the integrity of each wire pair itself, as being properly paired, by means of measurements made from only one end of the cable. In carrying out this method, I do not need to connect a terminating load to the remote end of the cable.

According to my novel method I select a pair of terminals or contacts that are believed to be connected to the ends of a twisted pair of wires inside the cable. Then, using only those terminals, I measure the coupling between the two wires of that assumed pair. If the measured inter-wire coupling meets a predetermined standard, that indicates that the wires of the assumed pair of wires are in fact wound about each other inside the cable rather being than wound with other wires of the cable.

As the first step in the process, at the end of the cable where testing is to be done, I connect all terminals essentially to ground except for the selected pair of terminals. Then I apply a time-varying input signal relative to ground to one terminal of the selected pair of terminals. At the other terminal of the selected pair of terminals I observe an output signal relative to ground that appears as a response to the input signal. I then compare the strength of the output signal relative to that of the input signal to establish whether the inter-wire coupling of the assumed pair of wires is sufficient.

DRAWING SUMMARY

DETAILED DESCRIPTION

(FIGS. 1–4)

Preliminary and Prequalification Tests

Figure 1A:
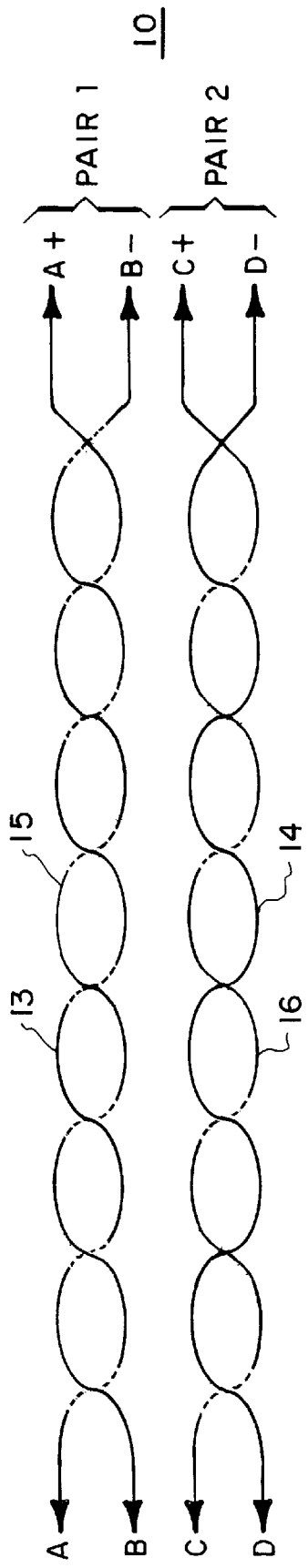
FIG. 1(a) is a schematic diagram of a set of properly paired wires in a cable.

According to the present invention the cable is first tested for short circuits and for continuity to discover open circuits. These and perhaps other basic tests are completed before testing for cross-talk or for mis-paired wires.

Each wire pair constitutes a transmission line having a series of incremental inductance values shunted by a corresponding series of incremental capacitance values. If the wire pair is too short, the coupling from one conductor to the other may not be sufficient to provide a reliable result with my test method. A minimum cable length is necessary in order to provide valid test results in using the novel method of the present invention. Although short cables can be measured, the minimum practical cable length for such measurements will be determined by cost considerations and hardware constraints. The typical minimum cable length for making the tests with my presently preferred apparatus is about five feet. I therefore prefer to use a prequalifying test to confirm that the cable is long enough to provide accurate test results.

The pre-qualification test is probably satisfactory if done on only a single wire of the cable. During the pre-qualifying test, none of the terminals are grounded. The test is made by applying a time-varying alternating current input signal to one wire that has been selected at random, and checking the terminals of all other wires at the same end of the cable to determine if there is any other line in the cable that has sufficient coupling to the input line. According to an algorithm for a computer control that I prefer to use, the first one of the other terminals to be checked is the terminal that is assumed to belong to the same wire pair as the wire to which the input signal is applied. This test does not necessarily assume that the wires are paired either correctly or incorrectly; it just establishes that sufficient total coupling, both inductive and capacitive, exists between the input wire and one other wire, wherever it may be connected.

Testing for Correct Pairing

After the pre-qualification of the entire cable, an actual test will be made on each of the assumed wire pairs, one at a time. A time-varying "transmit" or input signal relative to ground is applied to a terminal representing an input wire, and a response relative to ground is measured on the other terminal that is assumed to belong to the same wire pair. All of the wire pairs are tested for mis-pairing, one pair at a time.

According to the present invention, each wire pair is tested for correct pairing by measuring the signal coupled from one wire of the pair to the other wire of the same pair, with all other wires of the cable connected to ground. This contrasts with conventional methods that measure signal loss or spill-over from one wire pair to another wire pair. This technique minimizes test time, since only one measurement need be made for each purported wire pair, rather than measuring the spill-over to multiple other wire pairs.

Thus the method includes the step of selecting a pair of conductors, in which one of the conductors is capable of inducing a signal on the other, and in which each conductor has a test end and a non-test end, the non-test end of the conductors being open circuited. Then a time varying input signal relative to ground is applied to the test end of one conductor of the selected pair of conductors. The test end of the other conductor is monitored, and the magnitude of the induced signal relative to ground is compared to that of the input signal so as to determine whether proper coupling exists between the two conductors of the supposed twisted wire pair.

More specifically, in the method of testing for a possible mis-pairing of assumed wire pairs, one pair of terminals at one end of the cable is selected to be tested. At the same end of the cable, all terminals except the selected pair of terminals are connected essentially to ground. At the same end of the cable, a time-varying input signal relative to ground is applied to one of the terminals of the selected pair of terminals. Also at the same end of the cable, an output signal relative to ground appearing at the other terminal of the selected pair of terminals as a response to the input signal is observed. The strength of the output signal is then compared relative to the strength of the input signal to establish whether the inter-wire coupling of the assumed pair of wires is sufficient to indicate that they are in fact wound to each other rather than being wound with other wires of the cable. The preferred technique is to take three test samples separated by small intervals and average them to ensure accuracy before making the comparison.

It would be possible to make the test without grounding the other pairs of terminals, but that would increase the strength of the output or response signal for mis-paired wires by about an order of magnitude. In making this test, therefore, I prefer to ground all the other pairs of terminals at the input end of the cable, which causes the signal on the return conductor to be minimized when the wires are mis-paired, thus making the test more robust and reliable.

It might be thought possible to make the test with the remote or output end of the wire pair under test being terminated in a load. That approach might be satisfactory if the terminating load were inductive. However, it would cause a return current to flow by conduction in the return or output wire, which could either add to or subtract from the response signal that ought to be produced entirely by inductive and capacitive coupling from one wire to the other. I therefore greatly prefer to make the test with the remote or output end of the wire pair remaining open circuited.

One of the preliminary tests that is made prior to the cross-talk or mispairing test is for continuity. For the purpose of that preliminary test a terminating load that includes a diode may be placed across the output end of each wire pair, to establish both continuity and polarity. If that is done, I then prefer to apply essentially a unidirectional test signal of such polarity as to see the termination diode as a substantially open circuit.

Referring now to FIG. 1(a), cable 10 there illustrated shows the two wires 13, 15, of Pair 1 being correctly connected to their respective terrminals A and B at each end of the cable. At the same time, the two wires 14, 16, of Pair 2 are correctly connected to their respective terminals C and D at each end of the cable. A test of either Pair 1 or Pair 2 would show a sufficient degree of coupling between the wires of that pair.

Figure 1B:
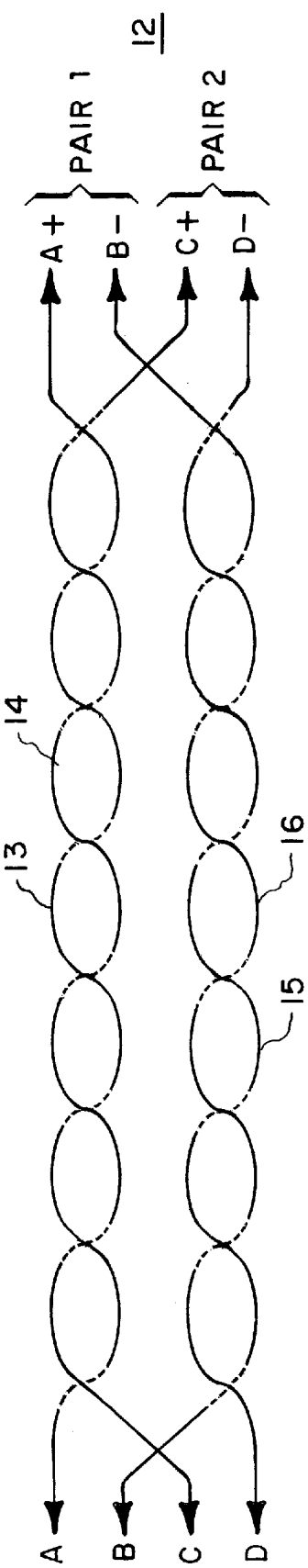
FIG. 1(b) is a schematic diagram of a set of mis-paired wires in a cable.

In FIG. 1(*b*), in cable 12 the same wire pairs are correctly connected at the ends but are mis-paired inside the cable. Thus, wire 15 is wound with wire 16 inside the cable, and wire 13 is wound with wire 14. A test made on terminals A and B will therefore show that there is insufficient coupling between the wires 13 and 14 and hence indicate that they are not a wound pair. The same result would apply to a test of terminals C and D, for wires 15 and 16. In other words, the wires are mis-paired inside the cable. In actual operation of the circuits to transmit data signals, the cross-talk or mutual interference between the A–B circuit and the C–D circuit will therefore be intolerable.

Figure 2:
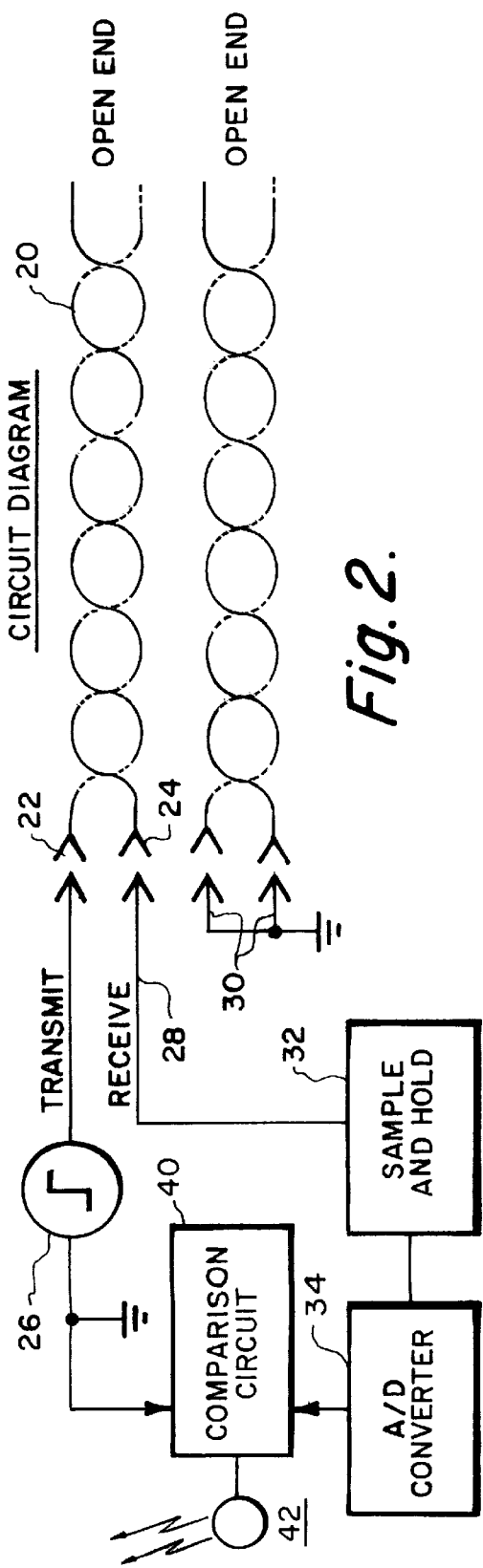
FIG. 2 is a conceptual schematic diagram of my novel testing apparatus while in operation testing a circuit.

Referring now to FIG. 2, a pair of terminals or contacts 22, 24, at the left-hand end of the cable represent an assumed wire pair that has been selected for test. The test apparatus includes a generator 26 for generating a time-varying "transmit" signal relative to ground that is applied as the input signal to one of those terminals, terminal 22, and a "receive" or output line that is connected to the other terminal, terminal 24, of the selected pair for receiving a response or output signal relative to ground. As also shown in the drawing figure, ground connections 30 are provided for all the other terminals at that end of the cable. All connections at the remote end of the cable, however, remain open.

As shown in FIG. 2, connected to the "receive" line at 28 is a sample-and-hold circuit 32, which applies a signal to an analog-to-digital converter 34. A comparison circuit 40 couples the output of the analog-to-digital converter to the generator 26 for comparing the received signal value to the strength of the input signal. Preferably also an indicator light 42 (FIG. 4) is provided, which will light up in response to a positive result from the comparison, indicating that the wires connected to the two selected terminals are in fact a properly twisted wire pair.

Figure 3:
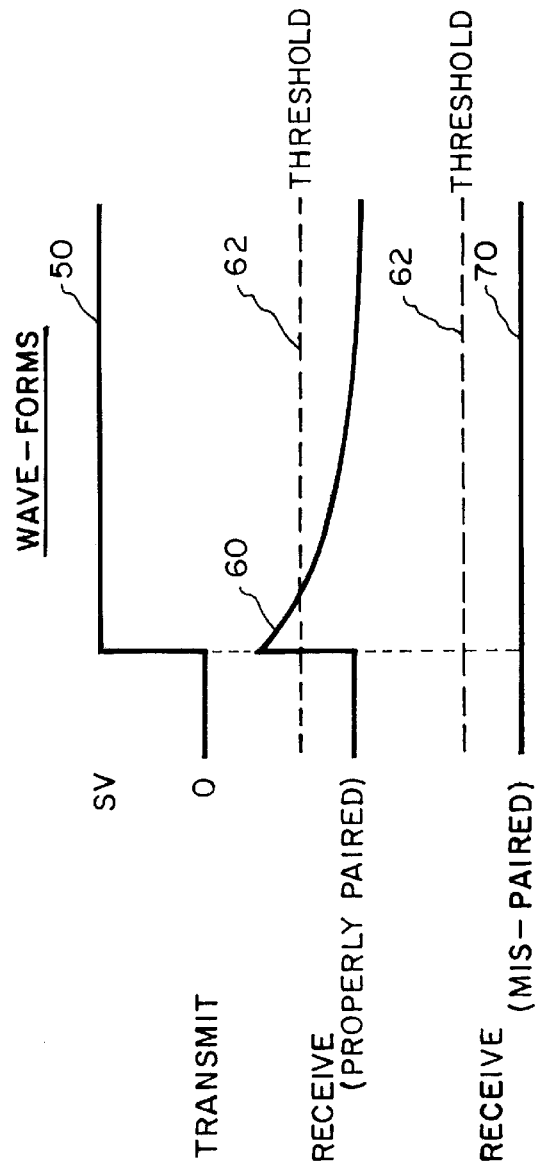
FIG. 3 shows the input and output wave forms for FIG. 2.

In general, the time-varying "transmit" signal may be any kind of continuous wave or transient signal. At present I prefer, however, to use a single voltage step, as shown in FIGS. 2 and 3. This is particularly true if a terminating diode that was be needed for a previous continuity testing step remains in place while the cross-talk test is being made. That is actually the presently preferred practice, as shown by the circuit of FIG. 4.

FIG. 3 shows the typical responses received on the "receive" terminal. Immediately below the input wave 50 is the typical output wave form 60 that is received if the wires are properly paired. The dotted line 62 indicates the threshold that had been established as a standard, as a predetermined percentage of the input signal strength. The wave depiction at the bottom of FIG. 3 shows the typical response 70 if the wires are mis-paired. It will be noted that a very small output signal of very short duration occurs, and clearly falls below the threshold value 62.

Figure 4:
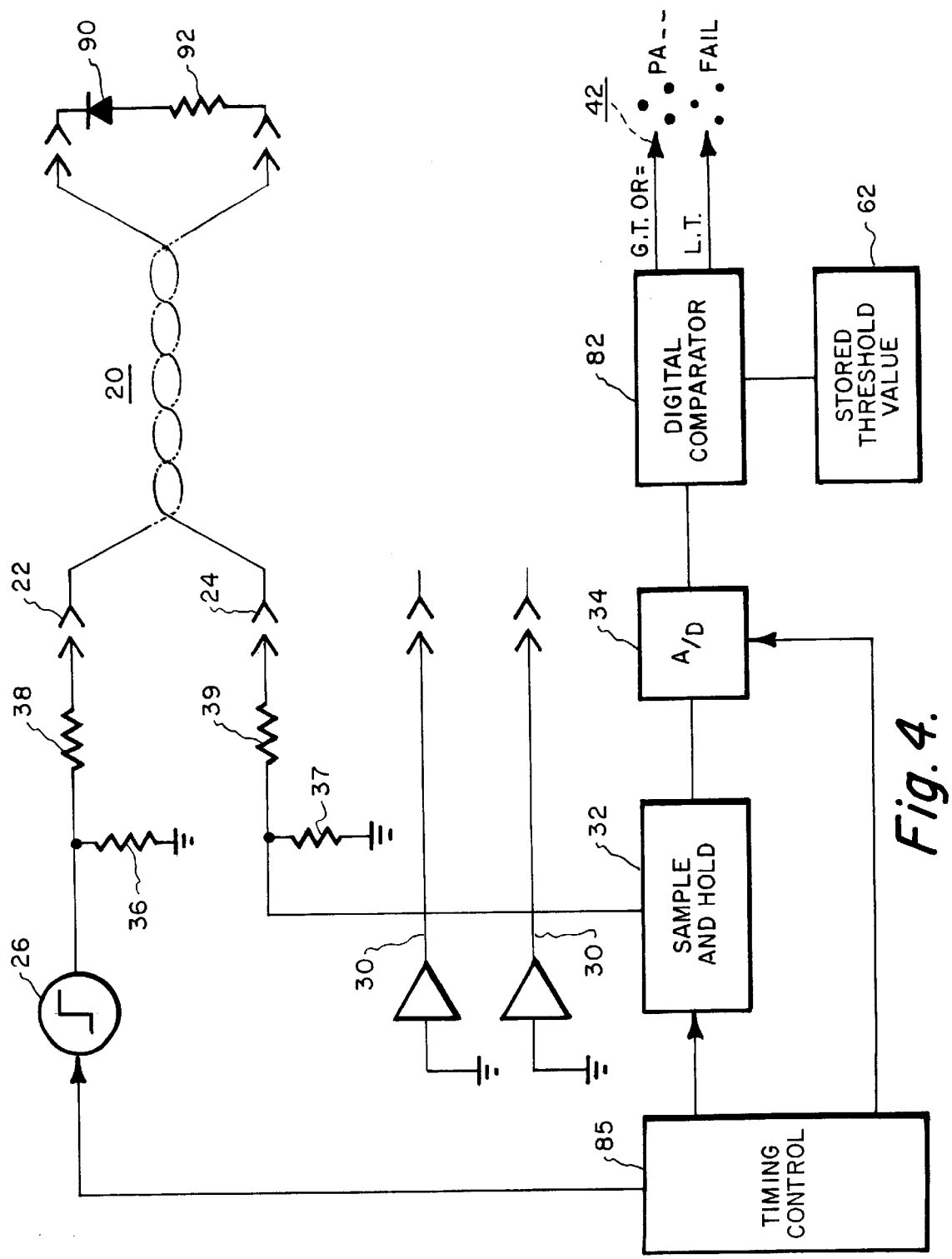
FIG. 4 is a schematic block diagram of the presently preferred test apparatus of the invention, shown partly in a one-line schematic diagram form and partly in a two-line schematic diagram form.

FIG. 4 is a schematic block diagram of the presently preferred circuit of the testing apparatus. The circuit incorporates a microprocessor type PIC16C74 manufactured by Microchip, a company located in Arizona. In this particular circuitry, the generator 26, the sample-and-hold circuit 32, the analog-to-digital converter 34, and comparison circuitry are all inside the microprocessor. The sample-and-hold circuit is provided with as high impedance as possible in the "hold" state. Thus the ground connection shown for generator 26 is a common ground for all of circuits 26, 32, 34, 62, and 82.

The actual comparison is made with respect to a stored value that represents the strength of the applied input signal. This stored value is equal to the threshold value 62 and is stored in a storage circuit designated as 62 in FIG. 4. Digital comparator 82 receives an output signal from the analog-to-digital converter 34, and compares that digitized output signal with the stored threshold signal 62. If the digitized output signal is greater than the threshold, the indicator light 42 is energized. As previously stated, the preferred technique is to take multiple test samples, preferably at least three, that are separated by small intervals and average them to ensure accuracy before making the comparison. A typical value of the stored comparison standard 62 for the output or receive signal may be about five or ten percent of the strength of the input signal.

As also shown in FIG. 4, the entire microprocessor circuitry is controlled by a timing control 85.

Some other specific details of the test circuitry as shown in FIG. 4 are important. It is preferred to use a terminating load at the remote end of the line being tested that includes a diode 90 connected in series with a resistor 92 across the remote end of the line. That terminating load facilitates earlier testing for both continuity and polarity of the test circuit. It is convenient to leave this terminating load in place, particularly because the entire testing program is preferably operated by a microprocessor that is in turn controlled by an appropriate algorithm. It is important, however, that the step voltage applied to input terminal 22 is of such polarity as to back-bias the diode, so that a response signal measured at output terminal 24 represents the degree of coupling between the wires, from which proper pairing of the wires may be determined.

In the transmit or input circuit, a resistor 38 having a value of 2.2 k ohms preferably couples the signal output of generator 26 to the input terminal 22, the other output of generator 26 being grounded resistor 36, having a value such as 47 k ohms, shunts the generator output to ground. In the receive circuit a similar coupling arrangment includes series resistor 39 and shunt resistor 37. The series resistors 38 and 39 are used to provide for current limiting, as is well known in the art.

In the receive circuit, the resistive element 37, having a value such as 47k ohms, is provided external to the microprocessor, shunting the sample-and-hold circuit to ground, which establishes the starting or quiescent condition of the circuit before a test is made. It also allows the response or receive signal to bleed off the output wire of the pair. Thus, the receive or output signal for properly paired wires follows a decay curve in accordance with an R-C time constant established by the resistance value of resistor 37 and the inter-wire capacitance of the wire pair being tested.

As an alternative, rather using the resistor 37 as presently shown, the receive circuitry may be arranged to essentially provide a short to ground prior to initiation of the test. Appropriate circuitry may be used to switch the load so as to maximize it and provide a much higher value during the test, which would eliminate the decay curve and facilitate the comparison.

Although the presently preferred form of the invention has been disclosed in detail in order to comply with the patent laws, it will be understood that the scope of the invention is to be judged only in accordance with the appended claims.

What I claim is:

1. In the process of testing an electrical cable which at one end thereof has a plurality of pairs of terminals that are assumed to be connected to respectively corresponding twisted pairs of the wires, the method of testing for correct pairing of assumed wire pairs comprising:

at the one end of the cable, while keeping the other end of the cable open circuited,
(a) selecting one pair of terminals to be tested;
(b) connecting all terminals except the selected pair of terminals essentially to ground;
(c) applying a time-varying test signal to one terminal of the selected pair of terminals so as to create a response signal on the other terminal by primarily capacitive coupling between the wires of the assumed pair;
(d) observing the response signal at the other terminal of the selected pair of terminals; and
(e) comparing the strength of the response signal relative to the test signal to a predetermined standard to establish whether the inter-wire coupling of the assumed pair of wires is sufficient to indicate that they are in fact wound about each other inside the cable rather than being wound with other wires of the cable.

2. The method of claim 1 in which the time-varying signal is a step voltage.

3. The method of claim 1 wherein the process is repeated for the terminals representing each other assumed wire pair.

4. The method of claim 1 wherein the predetermined standard is that the strength of the output signal must exceed about five or ten percent of the strength of the input signal.

* * * * *